(12) United States Patent
Liu et al.

(10) Patent No.: US 7,551,443 B2
(45) Date of Patent: Jun. 23, 2009

(54) HEAT-DISSIPATING MODULE CONNECTING TO A PLURALITY OF HEAT-GENERATING COMPONENTS AND RELATED DEVICE THEREOF

(75) Inventors: Cheng-Shing Liu, Taipei Hsien (TW); Ming-Chih Chen, Taipei Hsien (TW)

(73) Assignee: Wistron Corporation, Hsi-Chih City, Taipei Hsien (TW)

( * ) Notice: Subject to any disclaimer, the term of this patent is extended or adjusted under 35 U.S.C. 154(b) by 0 days.

(21) Appl. No.: 11/782,648

(22) Filed: Jul. 25, 2007

(65) Prior Publication Data
US 2009/0002937 A1    Jan. 1, 2009

(30) Foreign Application Priority Data
Jun. 27, 2007    (TW) .............................. 96210441 U

(51) Int. Cl.
*H05K 7/20* (2006.01)
(52) U.S. Cl. ....................... 361/700; 361/695; 361/697; 361/699; 174/15.1; 174/15.2; 165/80.4; 165/104.26; 165/104.33; 257/715
(58) Field of Classification Search ....................... None
See application file for complete search history.

(56) References Cited

U.S. PATENT DOCUMENTS

| | | | |
|---|---|---|---|
| 6,621,698 B2* | 9/2003 | Chang | 361/687 |
| 6,650,543 B2* | 11/2003 | Lai et al. | 361/700 |
| 6,966,363 B2* | 11/2005 | Gailus et al. | 165/185 |
| 7,068,509 B2* | 6/2006 | Bash et al. | 361/700 |
| 7,277,286 B2* | 10/2007 | Lee | 361/700 |
| 7,325,590 B2* | 2/2008 | Kim et al. | 165/104.33 |
| 7,327,571 B2* | 2/2008 | Giardina et al. | 361/700 |
| 7,339,787 B2* | 3/2008 | Cheng et al. | 361/695 |
| 7,372,698 B1* | 5/2008 | Tilton et al. | 361/701 |
| 2008/0218961 A1* | 9/2008 | Wu et al. | 361/687 |

* cited by examiner

*Primary Examiner*—Boris L Chervinsky
(74) *Attorney, Agent, or Firm*—Winston Hsu

(57) ABSTRACT

A heat-dissipating module includes a heat pipe and a heat-dissipating device. The heat pipe has a first end, a second end and a partition pipe section. The first end is connected to a first heat-generating component. The second end is connected to a second heat-generating component. The diameter of the partition pipe section is different from the diameter of the first end. The heat-dissipating device is disposed on the heat pipe and is located between the first end and the second end. The heat-dissipating device includes a first heat-dissipating part and a second heat-dissipating part. The first heat-dissipating part is located between the first end and the partition pipe section for dissipating heat generated by the first heat-generating component. The second heat-dissipating part is located between the second end and the partition pipe section for dissipating heat generated by the second heat-generating component.

10 Claims, 4 Drawing Sheets

HEAT-DISSIPATING MODULE CONNECTING TO A PLURALITY OF HEAT-GENERATING COMPONENTS AND RELATED DEVICE THEREOF

BACKGROUND OF THE INVENTION

1. Field of the Invention

The present invention relates to a heat-dissipating module and a related device thereof, and more specifically, to a heat-dissipating module connecting to a plurality of heat-generating components and a related device thereof.

2. Description of the Prior Art

With improvement of electronic technology, there are more and more complicated and powerful functions built in electronic products. In other words, an operational speed of a micro processing unit (such as a CPU chip, a VGA chip) built in an electronic product needs to become faster and faster so as to handle a huge amount of system work. However, heat also increases considerably with high operational speed of the micro processing unit. If the said heat is not dissipated properly, it may crash or damage the components in the electronic product due to overheating. Therefore, many auxiliary devices for dissipating heat generated by micro processing units built in an electronic product are manufactured accordingly. A heat pipe is a representative example in recent years.

A method for manufacturing a heat pipe involves adding working liquid into a metal pipe which is long, thin, hollow, and sealed at both ends. The inner wall of the metal pipe has a layer of capillary organization. The working liquid in the capillary organization can evaporate at about 30° C. since the air pressure inside the metal pipe is very low. In such a manner, when an end of the metal pipe is disposed at a heat-generating component as a high temperature end and the other end of the metal pipe is disposed at a heat-dissipating device as a low temperature end, the metal pipe starts to conduct heat. The heat transfer procedure of the metal pipe is provided as follows. First, heat generated by the heat-generating component goes through the wall of the metal pipe and then enters the capillary organization. At this time, the working liquid in the capillary organization starts evaporating into vapor due to being heated. Next, the said vapor gathers at the high temperature end and then moves to the low temperature end. When the said vapor arrives at the low temperature end, it condenses into liquid again due to a low temperature at the low temperature end. At this time, heat released during condensation of the said vapor is conducted to the outside of the metal pipe after passing through the capillary organization and the wall of the metal pipe sequentially. Then, the liquid generated during condensation of the said vapor flows through the capillary organization back to the high temperature end due to capillary pumping. Thus, heat conducted from the high temperature end of the metal pipe can be dissipated by repeating the said heat transfer procedure of the metal pipe. In addition, heat-dissipating efficiency of a heat pipe is extremely high. For example, in the same temperature difference, heat-dissipating efficiency of a heat pipe is at least 1000 times that of a metal rod.

As mentioned above, two ends of a heat pipe need to be a high temperature end and a low temperature end respectively. That is to say, an end of the heat pipe needs to be disposed at a heat-generating component as the high temperature end and the other end of the heat pipe needs to be disposed at a heat-dissipating device as the low temperature end. However, two or more than two heat pipes are usually required to conduct heat generated by heat-generating components from the high temperature end to the low temperature end since the relative positions of the heat-generating components do not exactly correspond to a heat pipe structure. Although heat generated by a plurality of heat-generating components can be dissipated by utilizing two or more than two heat pipes, it is still not a good solution due to an increase of cost. The aforementioned problem can be solved by changing the heat pipe structure (like bending) to conform to the relative positions of the heat-generating components. In such a manner, an end of a heat pipe can connect to a plurality of heat-generating components at the same time. However, assembly of the heat pipe and the heat-generating components will be another problem since the heights of the heat-generating components are not the same. Therefore, how to design a method for utilizing a heat pipe efficiently should be a concern.

SUMMARY OF THE INVENTION

As a result, the present invention provides a heat-dissipating module connecting to a plurality of heat-generating components and a related device thereof to solve the aforementioned problem.

The present invention provides a heat-dissipating module connecting to a plurality of heat-generating components comprising a heat pipe having a first end, a second end, and a partition pipe section, the first end being connected to a first heat-generating component, the second end being connected to a second heat-generating component, the diameter of the partition pipe section being different from the diameter of the first end of the heat pipe; and a heat-dissipating device disposed on the heat pipe and located between the first end and the second end, the heat-dissipating device comprising a first heat-dissipating part disposed on the heat pipe and located between the first end and the partition pipe section for dissipating heat generated by the first heat-generating component and conducted from the first end of the heat pipe; and a second heat-dissipating part disposed on the heat pipe and located between the second end and the partition pipe section for dissipating heat generated by the second heat-generating component and conducted from the second end of the heat pipe.

The present invention further provides a motherboard capable of dissipating heat generated by a plurality of heat-generating components comprising a first heat-generating component; a second heat-generating component; and a heat-dissipating module comprising a heat pipe having a first end, a second end, and a partition pipe section, the first end being connected to a first heat-generating component, the second end being connected to a second heat-generating component, the diameter of the partition pipe section being different from the diameter of the first end of the heat pipe; and a heat-dissipating device disposed on the heat pipe and located between the first end and the second end, the heat-dissipating device comprising a first heat-dissipating part disposed on the heat pipe and located between the first end and the partition pipe section for dissipating heat generated by the first heat-generating component and conducted from the first end of the heat pipe; and a second heat-dissipating part disposed on the heat pipe and located between the second end and the partition pipe section for dissipating heat generated by the second heat-generating component and conducted from the second end of the heat pipe.

These and other objectives of the present invention will no doubt become obvious to those of ordinary skill in the art after

DETAILED DESCRIPTION

Figure 1:
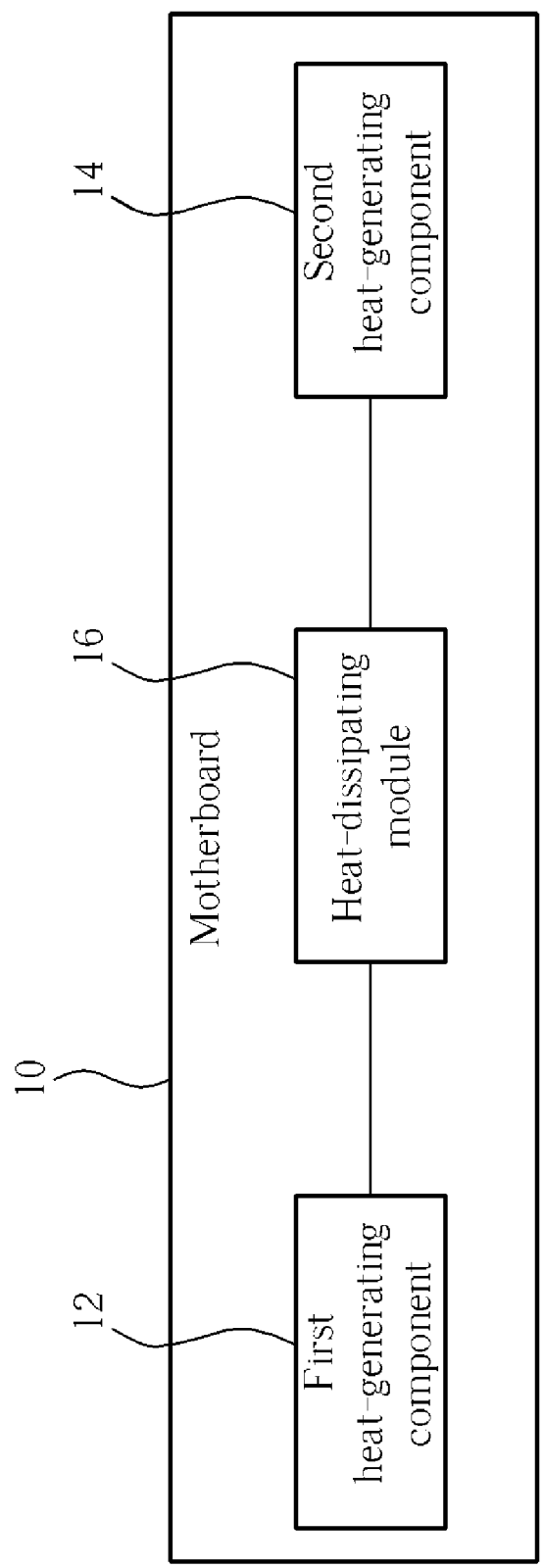
FIG. 1 is a functional block diagram of a motherboard according to the first embodiment of the present invention.

Please refer to FIG. 1. FIG. 1 is a functional block diagram of a motherboard 10 according to the first embodiment of the present invention. The motherboard 10 comprises a first heat-generating component 12, a second heat-generating component 14, and a heat-dissipating module 16. The heat-dissipating module 16 is used for dissipating heat generated by the first heat-generating component 12 and the second heat-generating component 14. The first heat-generating component 12 can be a CPU chip, a VGA chip, etc. The second heat-generating component 14 can be a CPU chip, a VGA chip, etc.

Figure 2:
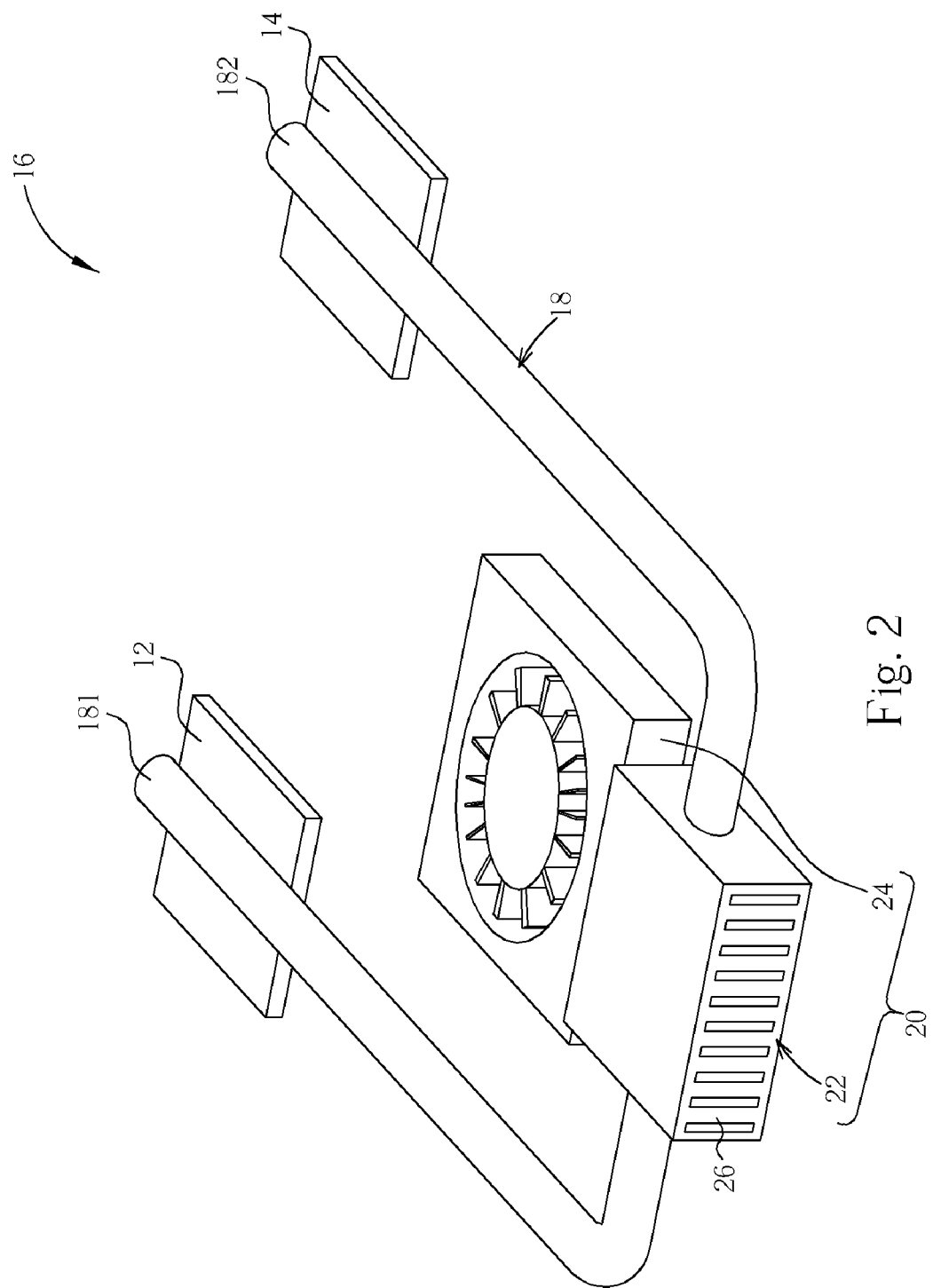
FIG. 2 is a diagram of the heat-dissipating module in FIG. 1.

More description for the heat-dissipating module 16 is provided as follows. Please refer to FIG. 2. FIG. 2 is a diagram of the heat-dissipating module 16 in FIG. 1. The heat-dissipating module 16 comprises a heat pipe 18 and a heat-dissipating device 20. The heat pipe 18 has a first end 181 and a second end 182. The first end 181 is connected to the first heat-generating component 12. The second end 182 is connected to the second heat-generating component 14. The heat-dissipating device 20 is disposed on the heat pipe 18 and is located between the first end 181 and the second end 182. The heat-dissipating device 20 comprises a heat-dissipating part 22 and an electric fan 24. The heat-dissipating part 22 has a plurality of heat-dissipating fins 26. Therefore, the heat-dissipating device 20 can utilizes the heat-dissipating part 22 and the electric fan 24 to dissipate heat generated by the first heat-generating component 12 and conducted from the first end 181 of the heat pipe 18 and heat generated by the second heat-generating component 14 and conducted from the second end 182 of the heat pipe 18. In other words, the first end 181 connected to the first heat-generating component 12 and the second end 182 connected to the second heat-generating component 14 are high temperature ends, and the section of the heat pipe 18, which is disposed on the heat-dissipating device 20, is a low temperature end. The heat transfer procedure of the heat pipe 18 is provided as follows. First, heat generated by the first heat-generating component 12 and the second heat-generating component 14 goes through the wall of the heat pipe 18 and then enters the capillary organization of the heat pipe 18. At this time, liquid in the capillary organization starts evaporating into vapor due to being heated. Next, the said vapor gathers at the high temperature ends (the first end 181 and the second end 182) and then moves to the low temperature end of the heat pipe 18. When the said vapor arrives at the low temperature end of the heat pipe 18, it condenses into liquid again due to a low temperature at the low temperature end of the heat pipe 18. At this time, heat released during condensation of the said vapor is conducted to the outside of the heat pipe 18 after passing through the capillary organization and the wall of the heat pipe 18 sequentially and is dissipated by the plurality of fins 26 and the electric fan 24. Then, the liquid generated during condensation of the said vapor flows through the capillary organization back to the high temperature end of the heat pipe 18 due to capillary pumping. Thus, heat conducted from the first end 181 and the second end 182 of the heat pipe 18 can be dissipated by repeating the said heat transfer procedure of the heat pipe 18. In addition, the number of the heat pipes is not limited to one. For example, if heat generated by heat-generating components is greater than the heat that one heat pipe can dissipate, the number of the heat pipes can increase according to the aforementioned configuration.

Figure 3:
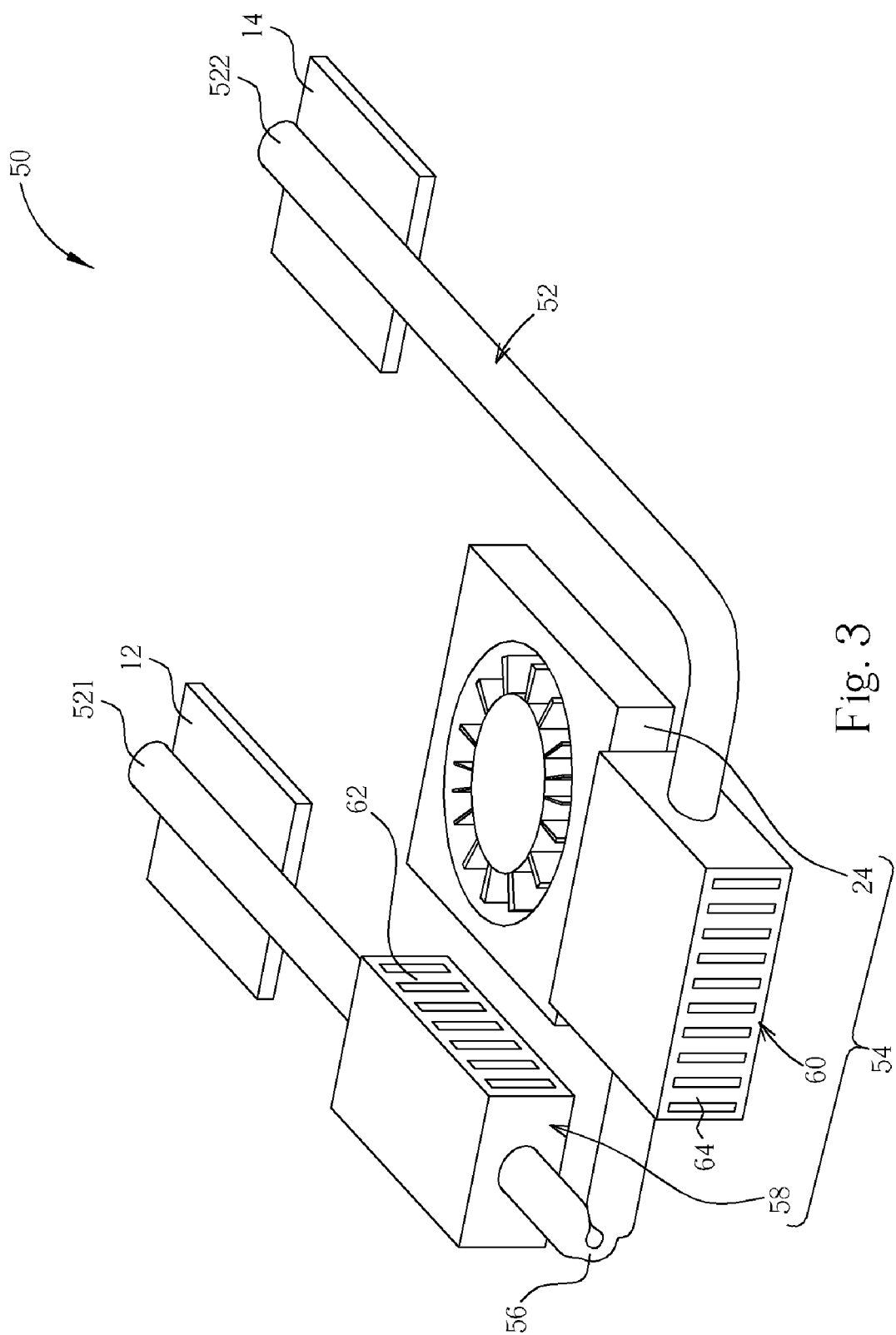
FIG. 3 is a diagram of the heat-dissipating module according to the second embodiment of the present invention.

Please refer to FIG. 3. FIG. 3 is a diagram of a heat-dissipating module 50 according to the second embodiment of the present invention. Components mentioned in both the first and the second embodiments represent components with similar functions or similar positions. Differences between the heat-dissipating module 16 in the first embodiment and the heat-dissipating module 50 are designs of the heat pipe and the heat-dissipating device. The heat-dissipating module 50 comprises a heat pipe 52 and a heat-dissipating device 54. The heat pipe 52 has a first end 521, a second end 522, and a partition pipe section 56. The first end 521 is connected to the first heat-generating component 12. The second end 522 is connected to the second heat-generating component 14. The diameter of the partition pipe section 56 is different from the diameter of the first end 521 of the heat pipe 52. The heat-dissipating device 54 comprises a first heat-dissipating part 58, a second heat-dissipating part 60, and an electric fan 24. The first heat-dissipating part 58 is disposed on the heat pipe 52 and is located between the first end 521 of the heat pipe 52 and the partition pipe section 56. The second heat-dissipating part 60 is disposed on the heat pipe 52 and is located between the second end 522 of the heat pipe 52 and the partition pipe section 56. The first heat-dissipating part 58 and the second heat-dissipating part 60 have a plurality of heat-dissipating fins 62 and 64 respectively. Therefore, the heat-dissipating device 54 can utilizes the first heat-dissipating part 58, the second heat-dissipating part 60, and the electric fan 24 to dissipate heat generated by the first heat-generating component 12 and conducted from the first end 521 of the heat pipe 52, and heat generated by the second heat-generating component 14 and conducted from the second end 522 of the heat pipe 52.

It should be mentioned that the diameter of the partition pipe section 56 is smaller than diameters of the first end 521 and the second end 522 as shown in FIG. 3. Its objective is to simulate the heat pipe 52 as two heat pipes by squelching the heat pipe 52 partially. In other words, after the heat pipe 52 is squelched partially, the capillary organization of the inner wall at the squelched position is damaged. As a result, the liquid condensed at the first heat-dissipating part 58 can only flow back to the first end 521 of the heat pipe 52, but cannot flow to the second end 522 of the heat pipe 52. In the same manner, the liquid condensed at the second dissipating part 60 can only flow back to the second end 522 of the heat pipe 52, but cannot flow to the first end 521 of the heat pipe 52. Therefore, two pipe sections divided by the partition pipe section 56 can be regarded as two independent heat pipes. In addition, the structure of the partition pipe section 56 is not limited to the said structure. For example, the diameter of the partition pipe section 56 can be larger than the diameter of the first end 521 or the diameter of the second end 522, or can be larger than the diameter of the first end 521 and be smaller than the diameter of the second end 522. That is to say, all the structures capable of intercepting the capillary pumping between the first end 521 and the second end 522 can be utilized as the structure of the partition pipe section 56.

Figure 4:
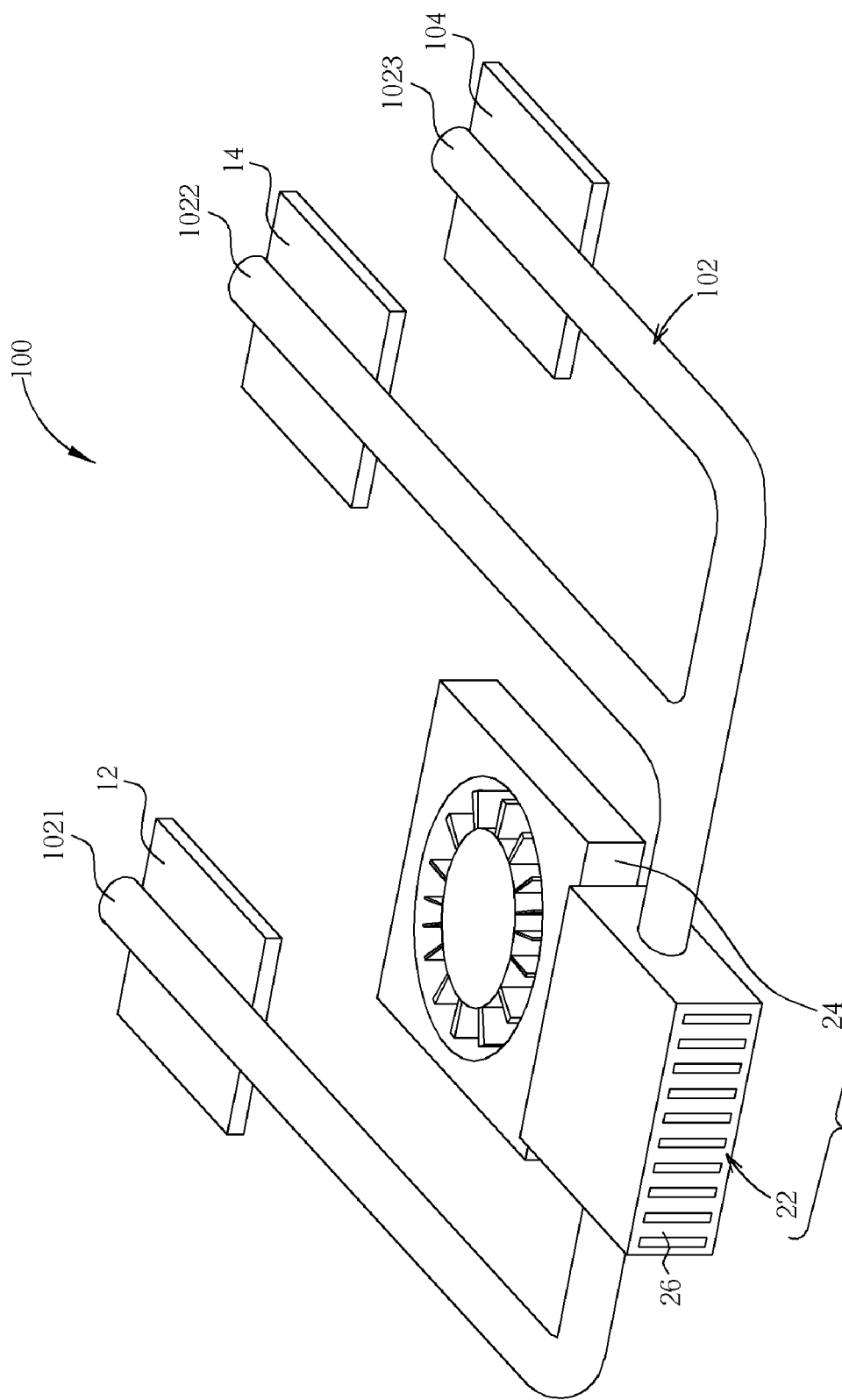
FIG. 4 is a diagram of the heat-dissipating module according to the third embodiment of the present invention.

Please refer to FIG. 4. FIG. 4 is a diagram of a heat-dissipating module 100 according to the third embodiment of the present invention. Components mentioned in both the first and the third embodiments represent components with similar functions or similar positions. A difference between the heat-dissipating module 16 in the first embodiment and the heat-dissipating module 100 is the design of the heat pipe. The heat-dissipating module 100 comprises a heat pipe 102 and a heat-dissipating device 20. The heat pipe 102 has a first end 1021, a second end 1022, and a third end 1023. The first end 1021 is connected to the first heat-generating component 12. The second end 1022 is connected to the second heat-generating component 14. The third end 1023 is connected to a third heat-dissipating component 104. The heat-dissipating device 20 is disposed on the heat pipe 102 and is located between the first end 1021, the second end 1022, and the third end 1023 as shown in FIG. 4. The heat-dissipating device 20 comprises a heat-dissipating part 22 and an electric fan 24. The heat-dissipating part 22 has a plurality of heat-dissipating fins 26 so as to dissipate heat generated by the first heat-generating component 12 and conducted from the first end 1021 of the heat pipe 102, heat generated by the second heat-generating component 14 and conducted from the second end 1022 of the heat pipe 102, and heat generated by the third heat-generating component 104 and conducted from the third end 1023 of the heat pipe 102. The heat transfer procedure of this embodiment is similar to the aforementioned embodiments and thus will not be described in detail.

The present invention involves connecting two ends of a heat pipe to heat-generating components and disposing a heat-dissipating device between two ends of the heat pipe so as to dissipate heat generated by the heat-generating components. Compared with the prior art connecting two ends of a heat pipe to a heat-generating component and a heat-dissipating device respectively, a heat-dissipating module and a related device thereof according to the present invention can utilize a heat pipe to dissipate heat generated by a plurality of heat-generating components. In such a manner, when it comes to dissipate heat generated by a plurality of heat-generating components, the present invention not only reduces cost of manufacture since the present invention just needs one heat pipe to dissipate heat generated by a plurality of heat-generating components, but also avoids assembly problems of the heat pipe and the plurality of heat-generating components while utilizing one heat pipe to connect to the plurality of the heat-generating components.

Those skilled in the art will readily observe that numerous modifications and alterations of the device and method may be made while retaining the teachings of the invention.

What is claimed is:

1. A heat-dissipating module connecting to a plurality of heat-generating components comprising:
   a heat pipe having a first end, a second end, and a partition pipe section, the first end being connected to a first heat-generating component, the second end being connected to a second heat-generating component, the diameter of the partition pipe section being different from the diameter of the first end of the heat pipe; and
   a heat-dissipating device disposed on the heat pipe and located between the first end and the second end, the heat-dissipating device comprising:
      a first heat-dissipating part disposed on the heat pipe and located between the first end and the partition pipe section for dissipating heat generated by the first heat-generating component and conducted from the first end of the heat pipe; and
      a second heat-dissipating part disposed on the heat pipe and located between the second end and the partition pipe section for dissipating heat generated by the second heat-generating component and conducted from the second end of the heat pipe.

2. The heat-dissipating module of claim 1, wherein both the first heat-dissipating part and the second heat-dissipating part have a plurality of heat-dissipating fins.

3. The heat-dissipating module of claim 1, wherein the heat-dissipating device further comprises an electric fan disposed adjacent to the first heat-dissipating part and the second heat-dissipating part.

4. The heat-dissipating module of claim 1, wherein the heat pipe further has a third end connected to a third heat-generating component, the heat-dissipating device being used for dissipating heat generated by the third heat-generating component and conducted from the third end of the heat pipe.

5. A motherboard capable of dissipating heat generated by a plurality of heat-generating components comprising:
   a first heat-generating component;
   a second heat-generating component; and
   a heat-dissipating module comprising:
      a heat pipe having a first end, a second end, and a partition pipe section, the first end being connected to a first heat-generating component, the second end being connected to a second heat-generating component, the diameter of the partition pipe section being different from the diameter of the first end of the heat pipe; and
      a heat-dissipating device disposed on the heat pipe and located between the first end and the second end, the heat-dissipating device comprising:
         a first heat-dissipating part disposed on the heat pipe and located between the first end and the partition pipe section for dissipating heat generated by the first heat-generating component and conducted from the first end of the heat pipe; and
         a second heat-dissipating part disposed on the heat pipe and located between the second end and the partition pipe section for dissipating heat generated by the second heat-generating component and conducted from the second end of the heat pipe.

6. The motherboard of claim 5, wherein both the first heat-dissipating part and the second heat-dissipating part have a plurality of heat-dissipating fins.

7. The motherboard of claim 5, wherein the heat-dissipating device further comprises an electric fan disposed adjacent to the first heat-dissipating part and the second heat-dissipating part.

8. The motherboard of claim 5, wherein the heat pipe further has a third end connected to a third heat-generating component, the heat-dissipating device being used for dissipating heat generated by the third heat-generating component and conducted from the third end of the heat pipe.

9. The motherboard of claim 5, wherein the first heat-generating part is a CPU (Central Processing Unit) chip.

10. The motherboard of claim 5, wherein the second heat-generating part is a VGA (Video Graphic Array) chip.

* * * * *